US010878905B1

(12) United States Patent
McCollum et al.

(10) Patent No.: US 10,878,905 B1
(45) Date of Patent: Dec. 29, 2020

(54) METAL FILAMENT RERAM CELL WITH CURRENT LIMITING DURING PROGRAM AND ERASE

(71) Applicant: Microchip Technology Inc., Chandler, AZ (US)

(72) Inventors: John L. McCollum, Orem, UT (US); Fengliang Xue, San Jose, CA (US)

(73) Assignee: Microchip Technology Inc., Chandler, AZ (US)

(*) Notice: Subject to any disclaimer, the term of this patent is extended or adjusted under 35 U.S.C. 154(b) by 0 days.

(21) Appl. No.: 16/525,546

(22) Filed: Jul. 29, 2019

Related U.S. Application Data (60) Provisional application No. 62/870,014, filed on Jul. 2, 2019.

(51) Int. Cl.
G11C 13/00 (2006.01)

(52) U.S. Cl.
CPC ........ *G11C 13/0069* (2013.01); *G11C 13/004* (2013.01); *G11C 13/0011* (2013.01); *G11C 13/0097* (2013.01); *G11C 2013/0045* (2013.01); *G11C 2013/0078* (2013.01)

(58) Field of Classification Search
CPC .............. G11C 13/0069; G11C 13/004; G11C 13/0011; G11C 13/0097; G11C 2013/0078; G11C 2013/0045; G11C 13/0002; G11C 11/5614; G11C 13/0009
See application file for complete search history.

(56) References Cited

U.S. PATENT DOCUMENTS

| | | | |
|---|---|---|---|
| 8,730,752 B1* | 5/2014 | Kamalanathan | .... G11C 13/0011 365/185.24 |
| 8,995,167 B1* | 3/2015 | Kim | ................... G11C 13/0069 365/148 |
| 9,691,478 B1 | 6/2017 | Lin et al. | |
| 2017/0179959 A1* | 6/2017 | McCollum | ......... H03K 19/0941 |
| 2017/0243645 A1 | 8/2017 | Chia et al. | |
| 2019/0051352 A1 | 2/2019 | McCollum | |
| 2019/0080753 A1 | 3/2019 | Tran et al. | |

FOREIGN PATENT DOCUMENTS

WO   2017007484 A1   1/2017

OTHER PUBLICATIONS

International Search Report and Written Opinion, PCT/US2019/052662, dated Jun. 23, 2020.

* cited by examiner

*Primary Examiner* — Ajay Ojha
(74) *Attorney, Agent, or Firm* — Glass and Associates; Kenneth Glass; Kenneth D'Alessandro (57) ABSTRACT

A ReRAM memory cell includes a ReRAM element, a programming circuit coupled to the ReRAM element and defining a programming circuit path in the ReRAM memory cell, and an erase circuit coupled to the ReRAM element and defining an erase circuit path in the ReRAM memory cell. The programming circuit path is separate from the erase circuit path.

11 Claims, 10 Drawing Sheets

PROGRAM

| | | Selected Column | | | Unselected Column | |
|---|---|---|---|---|---|---|
| | | BLN0 | BLP0 | | BLN1 | BLP1 |
| | | 0V | 1.2V | | 1.2V | 1.2V |
| Selected Row | WLP0 2.4V<br>PVA 2.4V<br>WLN0 1.2V | Selected Cell 12a | | 2.4V<br>2.4V<br>1V | Selected Row Unselected Column 12b | |
| | | 0V | 1.2V | | 1.2V | 1.2V |
| Unselected Row | WLP1 2.4V<br>PVB 1.2V<br>WLN1 0V | Unselected Row Selected Column 12c | | 2.4V<br>1.2V<br>0V | Unselected Row Unselected Column 12d | |

ERASE

| | | Selected Column | | | Unselected Column | |
|---|---|---|---|---|---|---|
| | | BLN0 | BLP0 | | BLN1 | BLP1 |
| | | 1V | 1.8V | | 1V | 1V |
| Selected Row | WLP0 1V<br>PVA 0V<br>WLN0 0V | Selected Cell 12a | | 1V<br>0V<br>0V | Selected Row Unselected Column 12b | |
| | | 1V | 1.8V | | 1V | 1V |
| Unselected Row | WLP1 1.8V<br>PVB 1V<br>WLN1 0V | Unselected Row Selected Column 12c | | 1.8V<br>1V<br>0V | Unselected Row Unselected Column 12d | |

READ

| | | Selected Column | | | Unselected Column | |
|---|---|---|---|---|---|---|
| | | BLN0 | BLP0 | | BLN1 | BLP1 |
| | | 0.3V | 0.3V | | 0V | 0V |
| Selected Row | WLP0 0.3V<br>PVA 0.3V<br>WLN0 1V | Selected Cell 12a | | 0.3V<br>0.3V<br>1V | Selected Row Unselected Column 12b | |
| | | 0.3V | 0.3V | | 0V | 0V |
| Unselected Row | WLP1 0.3V<br>PVB 0V<br>WLN1 0V | Unselected Row Selected Column 12c | | 0.3V<br>0V<br>0V | Unselected Row Unselected Column 12d | |

PROGRAM

|  |  | Selected Column |  | Unselected Column |  |
|---|---|---|---|---|---|
|  |  | BLP0 | BLN0 | BLP1 | BLN1 |
|  |  | 2.4V | 0V | 1V | 1V |
| Selected Row | WL0A 0V<br>WL0B 0V<br>WL0C 2.4V<br>WL0D 2.4V | Selected Cell 32a | 0V<br>0V<br>2.4V<br>2.4V | Selected Row Unselected Column 32b | |
|  |  | 2.4V | 0V | 1V | 1V |
| Unselected Row | WL0A 0V<br>WL0B 2.4V<br>WL0C 2.4V<br>WL0D 0V | Unselected Row Selected Column 32c | 0V<br>2.4V<br>2.4V<br>0V | Unselected Row Unselected Column 32d | |

ERASE

|  |  | Selected Column |  | Unselected Column |  |
|---|---|---|---|---|---|
|  |  | BLP0 | BLN0 | BLP1 | BLN1 |
|  |  | 1.8V | 0V | 1V | 1V |
| Selected Row | WL0A 1.8V<br>WL0B 1V<br>WL0C 0.8V<br>WL0D 0V | Selected Cell 32a | 1.8V<br>1V<br>0.8V<br>0V | Selected Row Unselected Column 32b | |
|  |  | 1.8V | 0V | 1V | 1V |
| Unselected Row | WL0A 1.8V<br>WL0B 0V<br>WL0C 1.8V<br>WL0D 0V | Unselected Row Selected Column 32c | 1.8V<br>0V<br>1.8V<br>0V | Unselected Row Unselected Column 32d | |

READ

|  |  | Selected Column |  | Unselected Column |  |
|---|---|---|---|---|---|
|  |  | BLP0 | BLN0 | BLP1 | BLN1 |
|  |  | 1.1V | 0.8V | 0.8V | 0.8V |
| Selected Row | WL0A 0V<br>WL0B 0.8V<br>WL0C 0V<br>WL0D 1.8V | Selected Cell 32a | 0V<br>0.8V<br>0V<br>1.8V | Selected Row Unselected Column 32b | |
|  |  | 1.1V | 0.8V | 0.8V | 0.8V |
| Unselected Row | WL0A 0V<br>WL0B 1.1V<br>WL0C 1.1V<br>WL0D 0V | Unselected Row Selected Column 32c | 0V<br>1.1V<br>1.1V<br>0V | Unselected Row Unselected Column 32d | |

PROGRAM

| | | Selected Column | | | | Unselected Column | | | |
|---|---|---|---|---|---|---|---|---|---|
| | | BL0A | BL0B | BL0C | BL0D | BL1A | BL1B | BL1C | BL1D |
| | | 3V | 1.5V | 1.5V | 0V | 1.5V | 1.5V | 1.5V | 1.5V |
| Selected Row | WL0A 1.5V | | | | | 1.5V | | | |
| | WL0B 1V | | Selected Cell 72a | | | 1V | Selected Row Unselected Column 72b | | |
| | WL0C 2V | | | | | 2V | | | |
| | WL0D 1.5V | | | | | 1.5V | | | |
| | | 3V | 1.5V | 1.5V | 0V | 1.5V | 1.5V | 1.5V | 1.5V |
| Unselected Row | WL0A 3V | | | | | 3V | | | |
| | WL0B 2V | | Unselected Row Selected Column 72c | | | 2V | Unselected Row Unselected Column 72d | | |
| | WL0C 1V | | | | | 1V | | | |
| | WL0D 0V | | | | | 0V | | | |

ERASE

| | | Selected Column | | | | Unselected Column | | | |
|---|---|---|---|---|---|---|---|---|---|
| | | BL0A | BL0B | BL0C | BL0D | BL1A | BL1B | BL1C | BL1D |
| | | 1.5V | 3V | 0V | 1.5V | 1.5V | 1.5V | 1.5V | 1.5V |
| Selected Row | WL0A 1.5V | | | | | 1.5V | | | |
| | WL0B 2V | | Selected Cell 72a | | | 2V | Selected Row Unselected Column 72b | | |
| | WL0C 1V | | | | | 1V | | | |
| | WL0D 1.5V | | | | | 1.5V | | | |
| | | 1.5V | 3V | 0V | 1.5V | 1.5V | 1.5V | 1.5V | 1.5V |
| Unselected Row | WL0A 0V | | | | | 0V | | | |
| | WL0B 1V | | Unselected Row Selected Column 72c | | | 1V | Unselected Row Unselected Column 72d | | |
| | WL0C 2V | | | | | 2V | | | |
| | WL0D 3V | | | | | 3V | | | |

READ

| | | Selected Column | | | | Unselected Column | | | |
|---|---|---|---|---|---|---|---|---|---|
| | | BL0A | BL0B | BL0C | BL0D | BL1A | BL1B | BL1C | BL1D |
| | | 1.1V | 0.8V | 0.8V | 0.8V | 0.8V | 0.8V | 0.8V | 0.8V |
| Selected Row | WL0A 0V | | | | | 0V | | | |
| | WL0B 0V | | Selected Cell 72a | | | 0V | Selected Row Unselected Column 72b | | |
| | WL0C 1.8V | | | | | 1.8V | | | |
| | WL0D 1.8V | | | | | 1.8V | | | |
| | | 1.1V | 0.8V | 0.8V | 0.8V | 0.8V | 0.8V | 0.8V | 0.8V |
| Unselected Row | WL0A 3V | | | | | 3V | | | |
| | WL0B 2V | | Unselected Row Selected Column 72c | | | 2V | Unselected Row Unselected Column 72d | | |
| | WL0C 1V | | | | | 1V | | | |
| | WL0D 0V | | | | | 0V | | | |

METAL FILAMENT RERAM CELL WITH CURRENT LIMITING DURING PROGRAM AND ERASE

FIELD OF THE INVENTION

The present invention relates to metal filament resistive random-access memory (ReRAM) elements. More particularly, the present invention relates to random-access memory cells formed from metal filament ReRAM elements that provide current limiting during programming and erasing.

BACKGROUND

Metal filament programmable elements known as resistive random-access memory elements (ReRAMs) have the capability to be erased to very high resistance states (mega-ohms to giga-ohms). These ReRAM elements can be very useful in producing low power consumption circuits. However, it is difficult to repeatably achieve a low-leakage high resistance erased state resulting from a sufficiently open circuit of the metal filament.

Previous attempts at manufacturing ReRAM elements incorporating metal filaments such as germanium sulfide have failed commercially because the technology is incompatible with standard integrated circuit fabrication processes. Current efforts employ amorphous silicon as a solid dielectric layer through which metal ions diffuse to form a metal filament during the programming process. Without being bound by any particular theory, and as an aid in understanding, it is presently understood that in order for the metal filament to diffuse though the amorphous silicon solid dielectric layer, the amorphous silicon solid dielectric layer must be significantly hotter than 200° C. so as to be in the glass form through which the positively charged metal ions will diffuse rapidly under the influence of a strong electric field. In order to erase a ReRAM element, the conductive filament must be similarly heated using an electric current that also supplies the driving electric field to cause the metal ions to diffuse back to the metal source electrode.

Figure 1A:
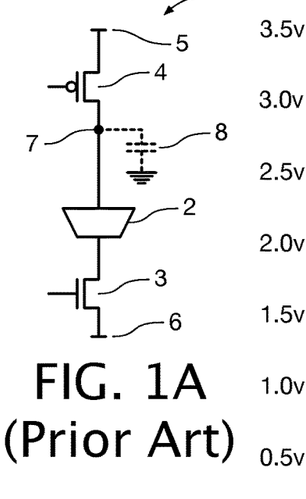
FIG. 1A is a schematic diagram of a representative prior-art ReRAM memory cell.

A representative prior-art ReRAM memory cell is shown in FIGS. 4A and 4B of United States Published Patent Application 2019/0051352, the entire contents of which is incorporated herein by reference and reproduced in FIG. 1A (reference numerals re-numbered). The memory cell 1 includes a ReRAM element 2 and an n-channel programming transistor 3. A p-channel transistor 4 is part of a sense amplifier circuit. The memory cell 1 uses the same circuit path from the bit line 5, through p-channel sense transistor 4, ReRAM element 2, n-channel programming transistor 3, and bit line 6 for programming and erasing.

The memory cell 1 of FIG. 1A is well suited for programming. During programming bit line 6 is driven to 0V, bit line 5 is driven to 3.3V, the n-channel transistor 3 is configured as a common source device and its gate is driven to 0.9V, placing it in saturation. The p-channel sense transistor 4 has its gate driven to 0V to minimize its resistance. Under these conditions the n-channel transistor 3 limits the current flow. During programming the capacitance 8 of the output node 7 discharges as the ReRAM element filament is formed but the n-channel transistor 3 limits the current to prevent a current spike during programming.

During erasing neither of transistors 3 and 4 are configured as common source devices. The bit line 6 is driven to 3.3V and bit line 5 is driven to V. The n-channel transistor 3 has its gate driven to 3.3V and is thus configured as a MOS diode and has about a 0.6V diode drop across it. The p-channel transistor 4 has its gate driven to −1V and is operating in its linear region and presents a low resistance.

Figure 1B:
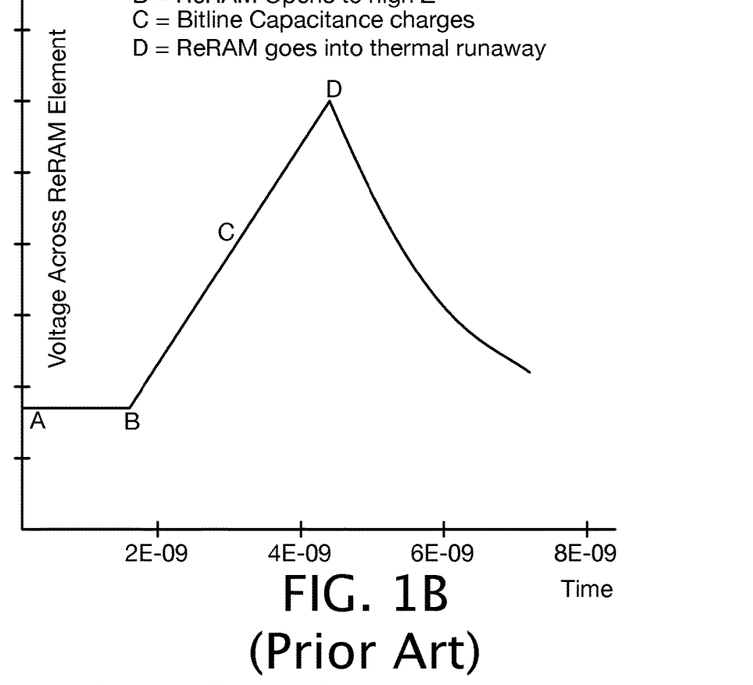
FIG. 1B is a graph of voltage vs. time showing the inadvertent re-programming of the ReRAM element of the memory cell of FIG. 1A during a prior-art erase cycle.

FIG. 1B shows a plot of voltage over time during erasure of a ReRAM element such as the ReRAM element 2 depicted in FIG. 1A. Before the filament of ReRAM element 2 opens the voltage across the ReRAM element 2 remains at about 0.8V as shown on the graph between points A and B. When the ReRAM filament opens at point B on FIG. 1B, the output node capacitance 8 is discharged towards 0V through the p-channel transistor 4 (point C). As the voltage across the ReRAM element 2 increases, the leakage current through the ReRAM element 2 increases. This increase in current increases the temperature in the metal filament of the ReRAM element which in turn generates more free electrons, further raising the temperature then generating more free electrons in a positive feedback mechanism until the temperature reaches thermal runaway at point D of FIG. 1B at which time the voltage across the ReRAM element 2 collapses due to a dramatic drop in its resistance. This drop in resistance allows the capacitance 8 to supply a spike current greater than the normal ReRAM erase current. This spike current reprograms the ReRAM element 2 by a high-current-density electron flow momentum mechanism that drives the metal ions in the direction of the electron flow back into the electrolyte. This high-current-density electron flow momentum programming mechanism is opposite in direction from the normal low-current ReRAM programming mechanism by which the metal ions flow in a direction opposite to the electron flow.

In the push-pull cells of FIGS. 5 through 10 of United States Published Patent Application 2019/0051352, the same problem occurs during one of programming and erasing depending on which ReRAM element-is being programmed or erased.

Figure 2:
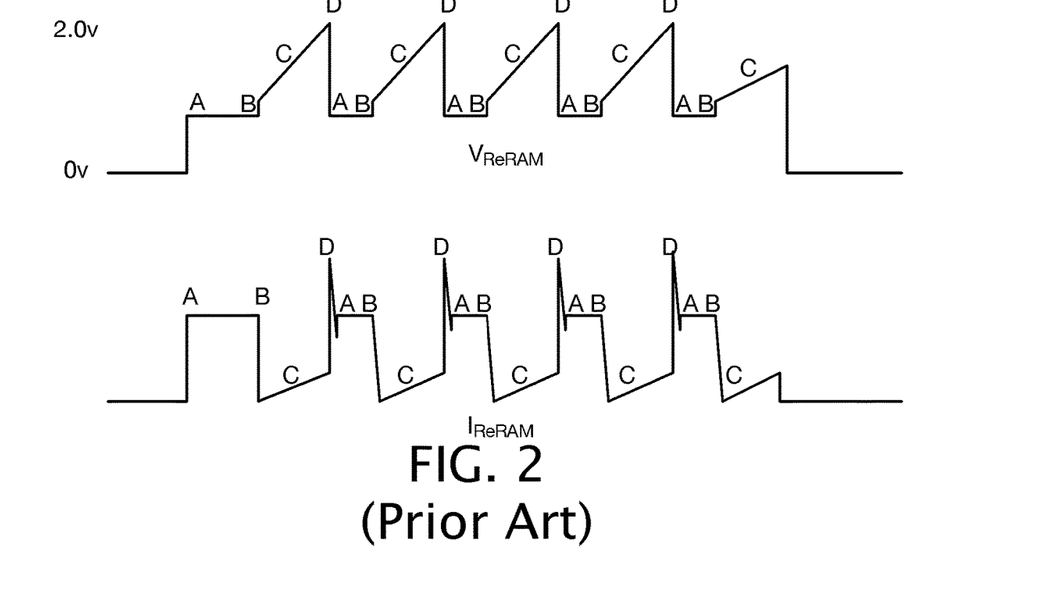
FIG. 2 are graphs showing voltage and current over time showing cycles of inadvertent re-programming and erasing of a ReRAM element during a prior-art erase cycle.

Referring to FIG. 1B in more detail, as the resistance of the ReRAM element 2 begins to rise, the current drops, reducing the power dissipated, as well as the temperature, thus freezing out any further diffusion of the metal ions back to the ion source (point B on FIG. 1). The voltage across ReRAM element 2 now begins to climb as shown along point C as the current through the p-channel transistor 4 discharges the output node capacitance 8 towards 0V. At point D the voltage across the ReRAM element reaches the maximum applied erase voltage. At this point the leakage current (approximately 1 µA to 10 µA) is high enough to raise the temperature of the ReRAM element 2 enough to begin thermal runaway, a dramatic increase in current which reprograms the ReRAM element 2 through the high-current-density electron flow momentum mechanism that drives the metal ions back into the electrolyte. The decrease in resistance of the ReRAM element 2 causes the voltage thereacross to collapse. When this happens in the prior art ReRAM cell 1, there is a spike current as shown in the lower ($I_{ReRAM}$) trace of FIG. 2, which depicts simplified ReRAM element voltage ($V_{ReRAM}$) and current ($I_{ReRAM}$) curves for repeated erase and unintended program cycles. This spike current is at a higher level than the current supplied by a standard erase pulse because the current is supplied by a discharge of the capacitance of the output node 8 coupled to the memory cell. As previously noted. currents of this magnitude can cause the cell to reprogram even though it is in the erase direction due to the high-electron flow momentum mechanism sometimes called an electron wind. This current will settle down to a steady state DC current shown between points A and B which will likely eventually erase the cell. As shown in FIG. 2, the cycle can repeat itself.

These repeated cycles can leave the ReRAM element in an intermediate state in which it will not erase.

BRIEF DESCRIPTION

According to one aspect of the invention, the ReRAM memory cell is arranged to provide current limiting in both programming and erasing. The current is limited so that so no spike current can drive the ReRAM into the high-current-density programming mode. This can be accomplished by employing a current limiting transistor in the cell in the erase path.

According to one aspect of the invention, a ReRAM memory cell includes a ReRAM element, a programming circuit coupled to the ReRAM element and defining a programming circuit path in the ReRAM memory cell, and an erase circuit coupled to the ReRAM element and defining an erase circuit path in the ReRAM memory cell. The programming circuit path is separate from the erase circuit path.

According to one aspect of the invention, the programming circuit includes at least one first transistor disposed in the programming circuit path and coupled to the ReRAM element; and the erase circuit includes at least one second transistor disposed in the erase circuit path coupled to the ReRAM element.

According to one aspect of the invention, the ReRAM element has a first terminal and a second terminal, the first terminal connected to an ion-source electrode in the ReRAM element and coupled to a row power line in a row of the memory array, the programming circuit includes an n-channel transistor coupled between the second terminal of the ReRAM element and a first column bit line in a column in the memory array, the n-channel transistor having a gate coupled to an n-word line in the row of the memory array, and the erase circuit includes a p-channel transistor coupled between the second terminal of the ReRAM element and a second column bit line in the column in the memory array, the n-channel transistor having a gate coupled to a p-word line in the row of the memory array.

According to one aspect of the invention, the ReRAM element has a first terminal and a second terminal, the first terminal connected to an ion-source electrode in the ReRAM element, the programming circuit includes a p-channel programming transistor coupled between the first terminal of the ReRAM element and a first column bit line in a column in the memory array, the p-channel programming transistor having a gate coupled to a first p-word line in a row of the memory array, and an n-channel programming transistor coupled between the second terminal of the ReRAM element and a second column bit line in the column in the memory array, the n-channel programming transistor having a gate coupled to a first n-word line in the row of the memory array, and the erase circuit includes an n-channel erase transistor coupled between the first terminal of the ReRAM element and the second column bit line in the column in the memory array, the n-channel erase transistor having a gate coupled to a second n-word line in the row of the memory array, and a p-channel erase transistor coupled between the second terminal of the ReRAM element and the first column bit line in the column in the memory array, the p-channel erase transistor having a gate coupled to a second p-word line in the row of the memory array.

According to one aspect of the invention, the ReRAM element has a first terminal and a second terminal, the first terminal connected to an ion-source electrode in the ReRAM element, the programming circuit includes series-connected first and second p-channel programming transistors coupled between the first terminal of the ReRAM element and a first column bit line in a column in the memory array, the first one of the series connected p-channel programming transistors having a gate coupled to a first word line in a row of the memory array, the second one of the series connected p-channel programming transistors having a gate coupled to a second word line in a row of the memory array, and series connected first and second n-channel programming transistors coupled between the second terminal of the ReRAM element and a second column bit line in the column in the memory array, the first one of the series connected n-channel programming transistors having a gate coupled to a third word line in a row of the memory array, the second one of the series connected n-channel programming transistors having a gate coupled to a fourth word line in a row of the memory array, and the erase circuit includes series-connected first and second n-channel erase transistors coupled between the first terminal of the ReRAM element and the second column bit line in the column in the memory array, the first one of the series connected n-channel erase transistors having a gate coupled to the first word line in a row of the memory array, the second one of the series connected n-channel erase transistors having a gate coupled to the second word line in a row of the memory array, and series-connected first and second p-channel erase transistors coupled between the second terminal of the ReRAM element and the first column bit line in the column in the memory array, the first one of the series connected p-channel programming transistors having a gate coupled to the third word line in a row of the memory array, the second one of the series connected p-channel programming transistors having a gate coupled to the fourth word line in a row of the memory array.

According to one aspect of the invention, a method for operating a ReRAM memory cell includes providing a ReRAM memory cell having a ReRAM element, a programming circuit coupled to the ReRAM element and defining a programming circuit path in the ReRAM memory cell including at least one transistor configured in common source mode, and an erase circuit coupled to the ReRAM element and defining an erase circuit path in the ReRAM memory cell including at least one transistor configured in common source mode, the erase circuit path being different from the programming circuit path, and applying an erase potential to the ReRAM memory cell through the erase circuit path to erase the ReRAM memory cell.

According to one aspect of the invention, the method includes measuring current drawn by the ReRAM memory cell while the erase potential is being applied, and removing the erase potential from the ReRAM memory cell when the current drawn by the ReRAM memory cell falls below a preselected current threshold.

According to one aspect of the invention, the preselected current threshold is about a 50% decrease from the initial value of erase current.

According to one aspect of the invention, the method further includes applying a programming potential to the ReRAM memory cell through the programming circuit path to program the ReRAM memory cell.

According to one aspect of the invention, a method for operating a ReRAM memory cell, the method includes applying an erase potential to the ReRAM memory cell for a nominal erase time, removing the erase potential from the ReRAM memory cell, measuring leakage current drawn by the ReRAM memory cell, if the leakage current drawn by the ReRAM memory cell is less than a predetermined threshold, ending the method, if the leakage current drawn by the ReRAM memory cell is greater than the predetermined threshold, reprogramming the ReRAM memory cell, and after applying an erase potential to the ReRAM memory cell for a nominal programming time and again applying the erase potential to the ReRAM memory cell for the nominal erase time.

According to one aspect of the invention, the ReRAM cell is marked as defective if the leakage current drawn by the ReRAM memory cell is greater than the predetermined threshold after reprogramming and erasing the ReRAM memory cell more than a predetermined number of times.

According to one aspect of the invention, a method for operating a ReRAM memory cell includes providing a ReRAM memory cell having a ReRAM element, a programming circuit coupled to the ReRAM element and defining a programming circuit path in the ReRAM memory cell including at least one transistor configured in common source mode, and an erase circuit coupled to the ReRAM element and defining an erase circuit path in the ReRAM memory cell including at least one transistor configured in common source mode, the erase circuit path being different from the programming circuit path, applying an erase potential to the ReRAM memory cell through the erase circuit path to cause an erase current to flow through the ReRAM memory cell. The erase current has a magnitude less than a magnitude of a programming current used to program the ReRAM memory cell.

According to one aspect of the invention, the erase current has a magnitude of between about 30% and about 75% of the magnitude of the programming current.

According to an aspect of the invention, the rise time of the applied voltage can be limited such that the ReRAM element is not reheated by excess leakage. This can be done using, for example, a stepped triangle voltage pulse.

According to an aspect of the invention, the current drop as the ReRAM element opens can be detected and used to shut down the erase mode.

According to an aspect of the invention, if an erased ReRAM element does not meet predetermined leakage limits, the ReRAM element can be reprogrammed in the normal manner and erased again.

According to an aspect of the invention, an erase voltage can be applied having a magnitude selected to supply current sufficient to open the connection (30% to 70% of programming current) which is also current limited using a common source transistor. Thus, when the current starts to drop the voltage will rise very quickly as the filament opens thus driving the metal ions past a few more atoms while it is still hot. The current shuts down as the required sustaining voltage exceeds the maximum voltage applied and no reverse spike occurs. This procedure should result in an improved erased state.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description is illustrative only and not in any way limiting. Other embodiments will readily suggest themselves to such skilled persons.

Figure 3A:
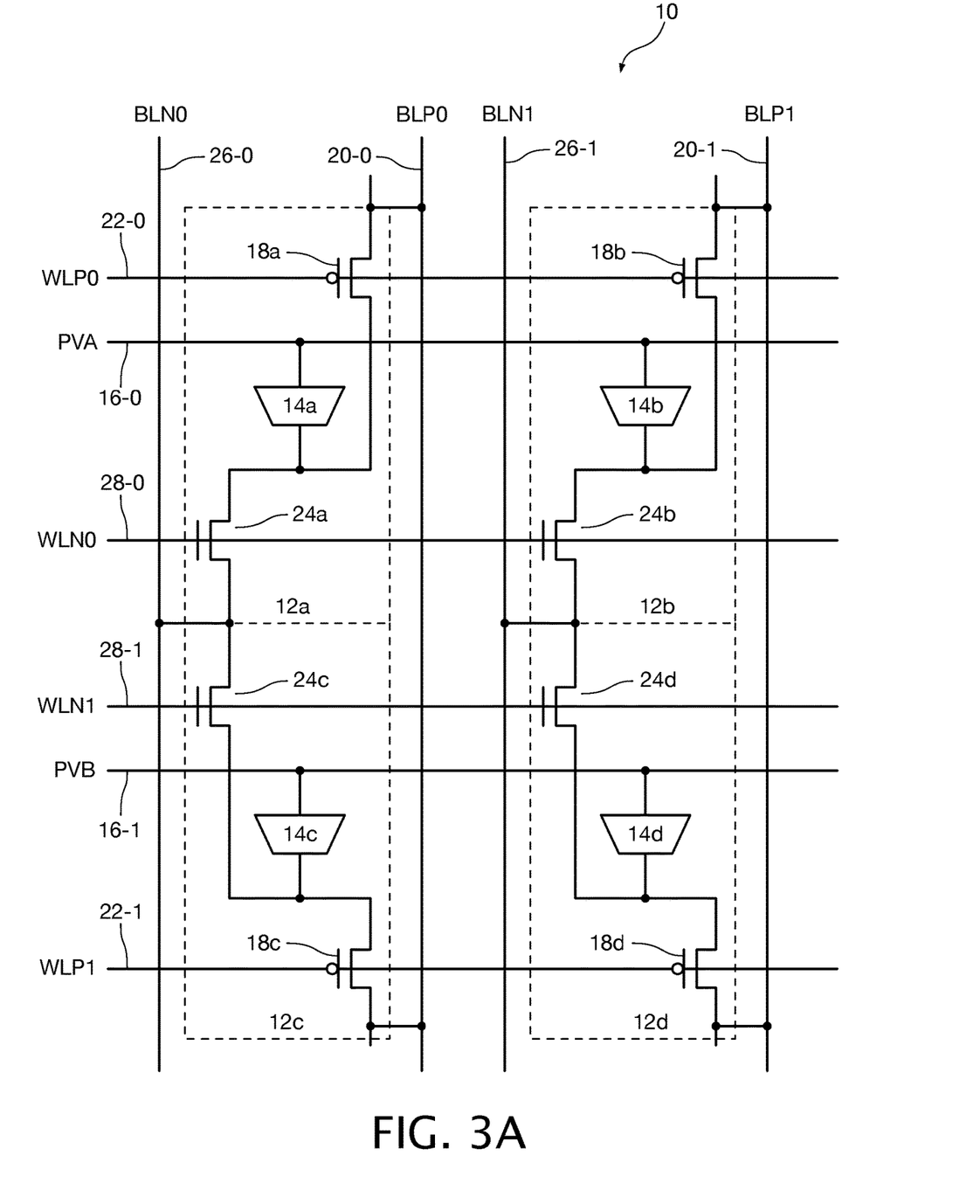
FIG. 3A is a schematic diagram of an illustrative embodiment of a metal filament ReRAM cell providing current limiting during programming and erasing in accordance with an aspect of the present invention.

Referring now to FIG. 3A, a schematic diagram shows an illustrative embodiment of an array 10 of metal filament ReRAM cells that provides current limiting during both programming and erasing in accordance with an aspect of the present invention. The array 10 is a representative array showing two rows and two columns of metal filament ReRAM cells. A first row of the array includes metal filament ReRAM cells 12a and 12b shown in dashed lines and a second row of the array includes metal filament ReRAM cells 12c and 12d shown in dashed lines.

Each memory cell includes a metal filament ReRAM element identified at reference numerals 14a, 14b, 14c, and 14d. Each ReRAM element in each row has first and second terminals. The one of its terminals closest to its ion source is depicted having the wide end, is designated as the first terminal and is connected to a row-decoded row-power line identified respectively as PVA, further identified at reference numeral 16-0, and PVB, further identified at reference numeral 16-1. The ion source terminals of ReRAM elements 14a and 14b are connected to row-power line 16-0 and the ion source terminals of ReRAM elements 14c and 14d are connected to row-power line 16-1.

The second terminal of each ReRAM element is connected through a respective p-channel transistor to a p-bit line associated with the column of the array containing the ReRAM cell. Thus, in the first row of the array 10, the second terminal of ReRAM element 14a is connected through p-channel transistor 18a to p-bit line BLP0 20-0 and the second terminal of ReRAM element 14b is connected through p-channel transistor 18b to p-bit line BLP1 20-1. The gates of p-channel transistors 18a and 18b are connected together to p-word line WLP0 22-0. In the second row of the array 10, the second terminal of ReRAM element 14c is connected through p-channel transistor 18c to p-bit line BLP0 20-0 and the second terminal of ReRAM element 14d is connected through p-channel transistor 18d to p-bit line BLP120-1. The gates of p-channel transistors 18c and 18d are connected together to p-word line WLP122-1.

In the first row of the array 10, the second terminal of ReRAM element 14a is also connected through n-channel transistor 24a to n-bit line BLN0 26-0 and the second terminal of ReRAM element 14b is also connected through n-channel transistor 24b to n-bit line BLN126-1. The gates of n-channel transistors 24a and 24b are connected together to n-word line WLN0 28-0. In the second row of the array 10, the second terminal of ReRAM element 14c is also connected through n-channel transistor 24c to n-bit line BLN0 26-0 and the second terminal of ReRAM element 14d is also connected through n-channel transistor 24d to n-bit line BLN126-1. The gates of n-channel transistors 24c and 24d are connected together to the n-word line WLN128-1.

The arrangement of the memory cells 12a through 12d allows for control of both programming and erase current because one of the transistors used for programming or erasing is always configured in common-source mode. Separate programming circuit and erase circuit paths are provided for programming and erasing of the memory cells.

In the memory array of FIG. 3A, the n-channel transistor (24a-d) coupled to the ReRAM element in each memory cell is a programming transistor forming a programming circuit, and the p-channel transistor (18a-d) coupled to the ReRAM element in each memory cell is an erase transistor forming an erase circuit When programming the memory cells of the memory array of FIG. 3A, the row-power line (e.g. PVA or PVB) for the row containing the memory cell to be programmed is driven to a programming potential (e.g., 2V) and a voltage is applied to the word line (e.g. WLN or WLN1) containing the memory cell to be programmed so as to turn on the n-channel transistor in the cell. The n-bit line (e.g., BLN0 or BLN1) containing the memory cell to be programmed is driven to 0V. The n-bit line for all of the unselected columns and the p-bit lines (BLP0 and BLP1) for all of the columns is driven to an intermediate voltage such as 1V and the p-word line (WLP0 and WLP1) for all of the memory cells in the array is driven to a voltage such as 2V to keep the p-channel transistors in all of the memory cells turned off.

When erasing the memory cells of the memory array of FIG. 3A, the p-bit line (BLP0 or BLP1) for the column containing the selected memory cell is driven to an erase potential (e.g., 1.8V in an embodiment where the erase potential is lower than the programming potential), the row-power line (PVA or PVB) for the row containing the cell to be erased is driven to V, the p-word line (WLP0 or WLP1) for the row containing the selected memory cell is driven to a voltage (e.g., 1V) to turn on the p-channel transistor in the selected memory cell. Under these conditions, the p-channel transistor is operating in common source mode, with the p-bit line of the selected memory cell connected to its source terminal, and the current therethrough is limited by the gate to source voltage. The p-bit line for all of the unselected columns and the n-bit lines for all of the columns is driven to an intermediate voltage such as 1V and the n-word line for all of the memory cells in the array is driven to V to keep the n-channel transistors in all of the cells turned off.

When reading the memory cells of the memory array of FIG. 3A, the row-power line (PVA or PVB) for the row containing the memory cell to be read is driven to a low voltage such as 0.3V and a voltage is applied to the n-word line (WLN0 or WLN1) containing the memory cell to turn on the n-channel transistor in the memory cell. All of the p-word line (WLP0 and WLP1) are driven to a voltage, such as 0.3V so as to turn off the p-channel transistor in all of the memory cells, the n-bit line (BLN0 or BLN1) of the column containing the selected memory cell is first set to a voltage, such as 0.2V, and the current on the n-bit line (BLN0 or BLN1) of the column containing the selected memory cell is sensed. The n-word line (WLN or WLN1) in the unselected row is set to 0 V so as to turn of the respective n-channel transistor in the unselected memory cells. Alternately, the memory cell to be read can be sensed through the p-channel transistor by setting the row power line (PVA or PVB) to a voltage such as 0.8V, the gate of the p-channel transistor to 0V by the respective p-word line (WLP0 or WLP1) and sensing the current on the respective bit line (BLP0 or BLP1).

Figure 3B:
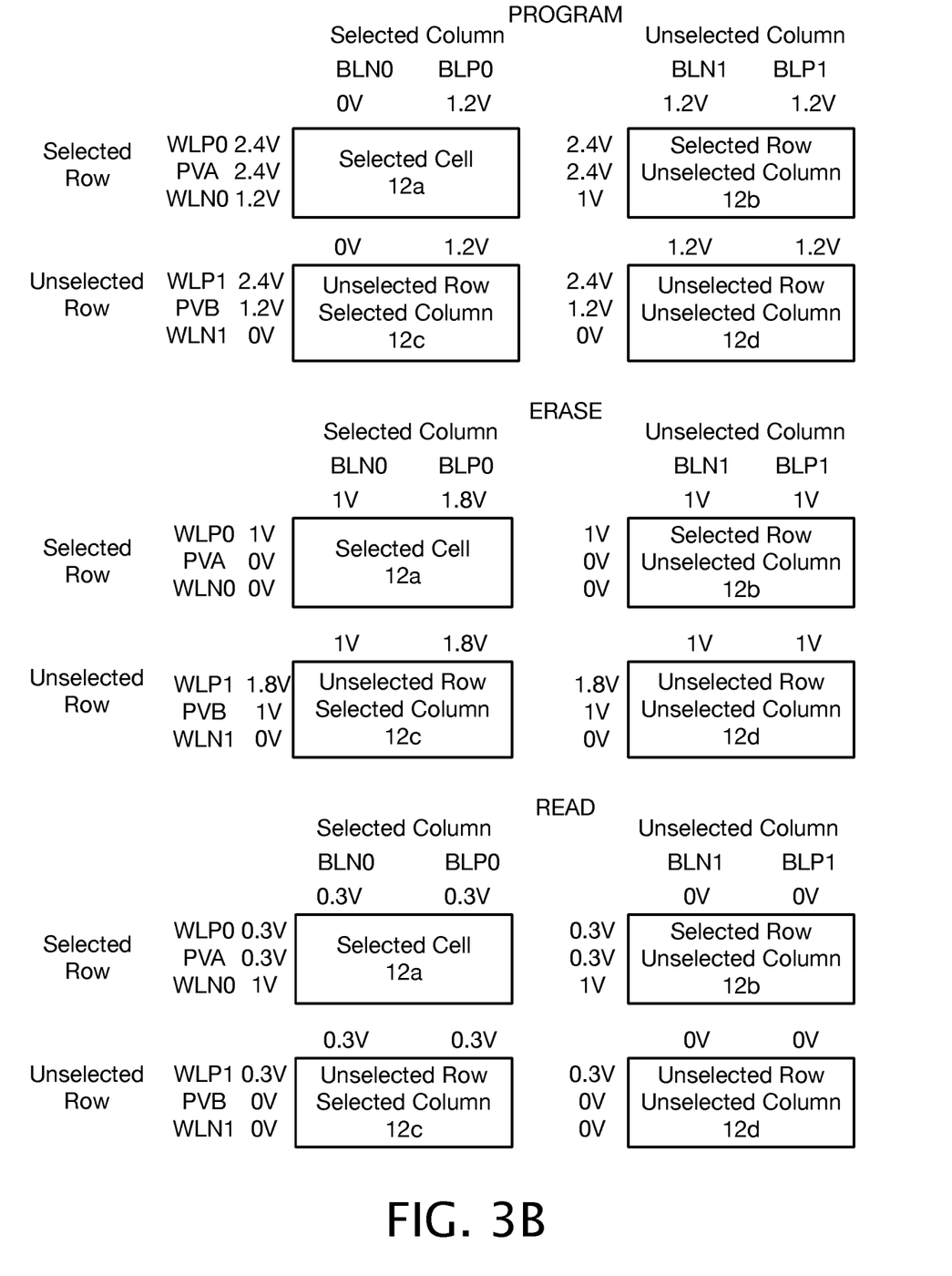
FIG. 3B is a drawing showing illustrative voltages applied to selected and unselected memory cells in the array of FIG. 3A during programming, erasing, and reading operations.

Referring now to FIG. 3B, a drawing shows illustrative sets of voltages that are applied to selected and unselected memory cells in the rows and columns of the array 10 of FIG. 3A during programming, erasing, and reading operations. For purposes of illustration in FIG. 3B, memory cell 12a of FIG. 3A is designated in FIG. 3B as the selected cell for programming, erasing and reading, while memory cells 12b, 12c, and 12d are designated as unselected cells. In the particular embodiment shown in FIG. 3B the erase voltage (i.e. the voltage applied to the p-bit line in relation to the row power line) is set to be 75% of the programming voltage (i.e. the voltage applied to row power line in relation to the n-bit line) to produce an erase current set by biasing the common source p-channel transistor 18a that is no larger than 75% of the programming current to avoid excessive erase current that could damage the ReRAM element in accordance with an aspect of the present invention. The erase current should preferably be lower than the programming current and is preferably between about 30% to about 75% of the programming current. Persons of ordinary skill in the art will appreciate that the voltages used in any particular embodiment of the invention will depend on the actual geometry of the ReRAM element used. From an examination of FIG. 3B, the sets of voltages to be applied to program, erase and read any of memory cells 12b, 12c, and 12d in particular embodiments will be readily apparent to such skilled persons.

As can be seen from an examination of FIG. 3A, the circuit component arrangement and biasing is such that the one of the p-channel transistor and the n-channel transistor in each cell that is in its on state in the circuit is configured in a common source mode. The common source transistor is set by the appropriate respective word line voltage to operate in saturation and thus the respective transistors of the memory cell provide current limiting during both programming and erasing when the ReRAM element is in its low resistance state thus preventing the overcurrent that occurs during state switching in prior-art ReRAM memory cell operation and assuring more consistent erasing.

Figure 4A:
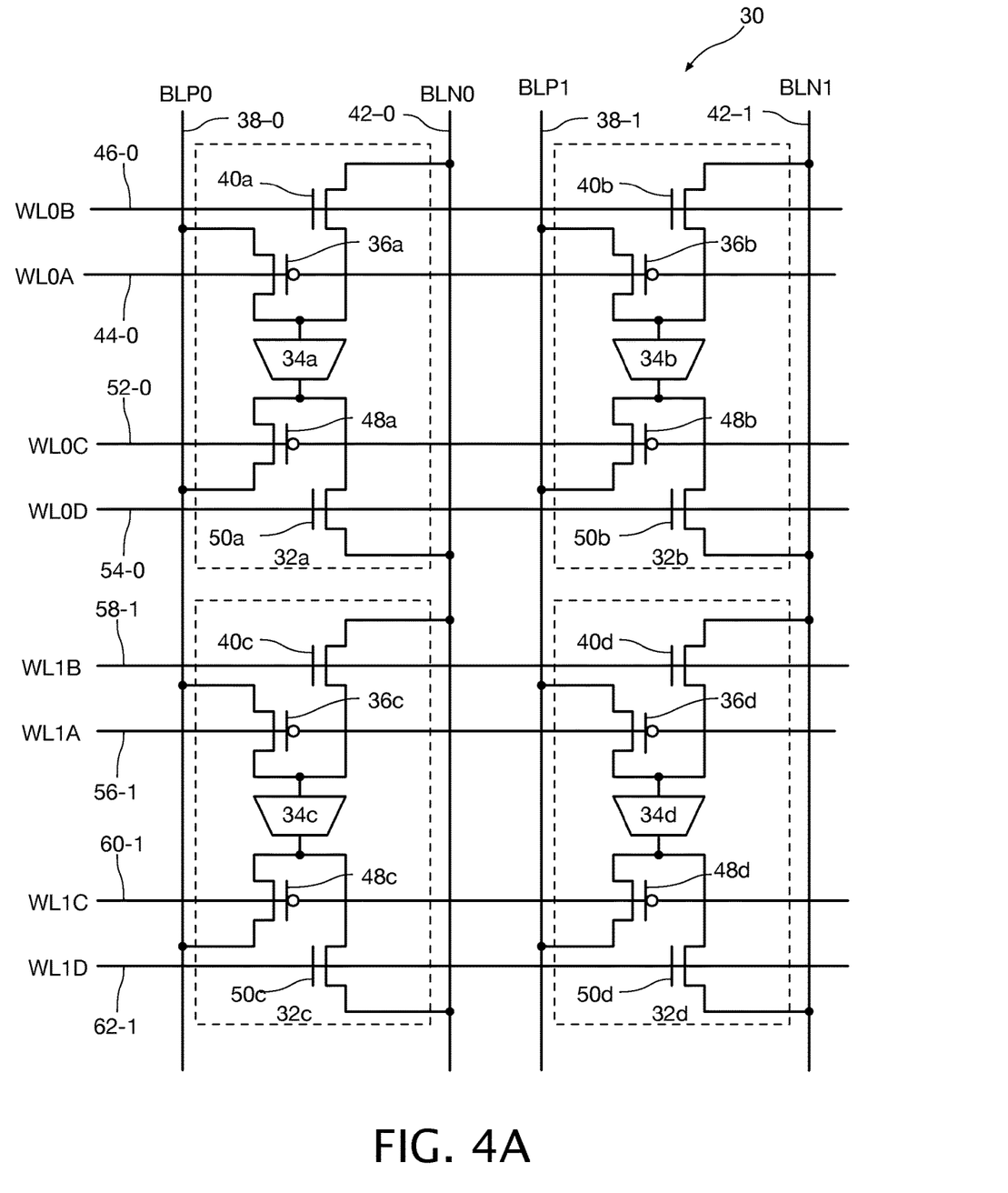
FIG. 4A is a schematic diagram of another illustrative embodiment of a metal filament ReRAM cell providing current limiting during programming and erasing in accordance with an aspect of the present invention.

Referring now to FIG. 4A, a schematic diagram shows another illustrative embodiment of an array 30 of metal filament ReRAM cells in accordance with an aspect of the present invention that provides current limiting during programming and erasing in accordance with an aspect of the present invention. The array 30 is a representative array showing two rows and two columns of metal filament ReRAM cells. A first row of the array includes metal filament ReRAM cells 32a and 32b shown in dashed lines and a second row of the array includes metal filament ReRAM cells 32c and 32d shown in dashed lines.

Each memory cell 32a, 32b, 32c, and 32d includes a metal filament ReRAM element identified at reference numerals 34a, 34b, 34c, and 34d. Each ReRAM element in each row has first and second terminals. The one of its terminals closest to its ion source is depicted having the wide end and is designated as the first terminal.

The first terminal of each ReRAM element is connected through a p-channel transistor to a p-bit line associated with the column of the array containing the ReRAM cell (BLP0 and BLP1, respectively). Thus, in the first row and first column of the array 30, the first terminal of ReRAM element 34a is connected through p-channel transistor 36a to p-bit line BLP0 38-0 associated with the first column of the array 30 and through n-channel transistor 40a to an n-bit line BLN0 42-0. The gate of the p-channel transistor 36a is connected to a p-word line WL0A 44-0 associated with the first row of the array 30 and the gate of the n-channel transistor 40a is connected to an n-word line WL0B 46-0 associated with the first row of the array 30. The second terminal of ReRAM element 34a is connected through p-channel transistor 48a to the p-bit line PBL0 38-0 and through n-channel transistor 50a to the n-bit line BLN0 42-0. The gate of the p-channel transistor 48a is connected to a p-word line WL0C 52-0 associated with the first row of the array 30 and the gate of the n-channel transistor 50a is connected to an n-word line WL0D 54-0 associated with the first row of the array 30.

In the first row and second column of the array 30, the first terminal of ReRAM element 34b is connected through p-channel transistor 36b to a p-bit line BLP1 38-1 associated with the second column of the array 30 and through n-channel transistor 40b to an n-bit line BLN1 42-1. The gate of the p-channel transistor 36b is connected to the p-word line WL0A 44-0 and the gate of the n-channel transistor 40b is connected to the n-word line WL0B 46-0. The second terminal of ReRAM element 34b is connected through p-channel transistor 48b to the p-bit line BLP138-1 and through n-channel transistor 40b to the n-bit line BLN142-1. The gate of the p-channel transistor 48b is connected to the p-word line WL0C 52-0 and the gate of the n-channel transistor 50b is connected to the n-word line WL0D 54-0.

In the second row and first column of the array 30, the first terminal of ReRAM element 34c is connected through p-channel transistor 36c to the p-bit line BLP0 38-0 associated with the first column of the array 30 and through n-channel transistor 40c to the n-bit line BLN0 42-0. The gate of the p-channel transistor 36c is connected to a p-word line WL1A 56-1 associated with the second row of the array 30 and the gate of the n-channel transistor 40c is connected to an n-word line WL1B 58-1 associated with the second row of the array 30. The second terminal of ReRAM element 34c is connected through p-channel transistor 48c to the p-bit line BLP0 38-0 and through n-channel transistor 50c to the n-bit line BLN0 42-0. The gate of the p-channel transistor 48c is connected to a p-word line WL1C 60-1 associated with the second row of the array 30 and the gate of the n-channel transistor 50c is connected to an n-word line WL1D 62-1 associated with the second row of the array 30.

In the second row and second column of the array 30, the first terminal of ReRAM element 34d is connected through p-channel transistor 36d to the p-bit line BLP1 38-1 associated with the second column of the array 30 and through n-channel transistor 40d to the n-bit line BLN1 42-1. The gate of the p-channel transistor 36d is connected to the p-word line WL1A 56-1 and the gate of the n-channel transistor 40d is connected to the n-word line WL1B 58-1. The second terminal of ReRAM element 34d is connected through p-channel transistor 48d to the p-bit line BLP1 38-1 and through n-channel transistor 50d to the n-bit line BLN142-1. The gate of the p-channel transistor 48d is connected to the p-word line WL1C 60-1 and the gate of the n-channel transistor 50d is connected to the n-word line WL1D 62-1.

In the memory array of FIG. 4A, the n-channel transistor (40a-d) and the p-channel transistor (48a-d) coupled to opposite terminals of the ReRAM element in each memory cell are programming transistors forming an erase circuit, and the p-channel transistor (36a-d) and the n-channel transistor (50a-d) coupled to opposite terminals of the ReRAM element in each memory cell form a programming circuit.

Figure 4B:
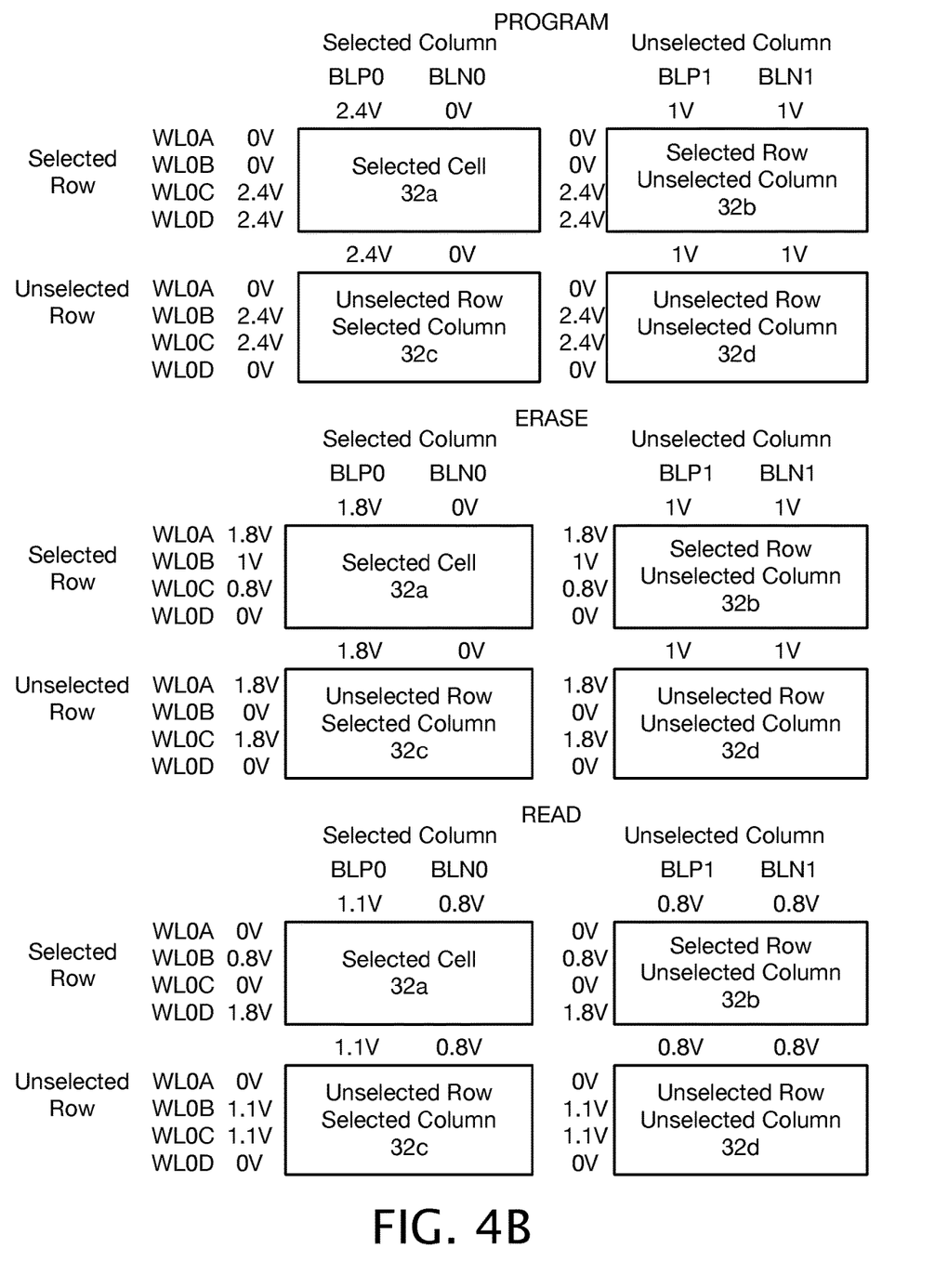
FIG. 4B is a drawing showing illustrative voltages applied to selected and unselected memory cells in the array of FIG. 4A during programming, erasing, and reading operations.

Referring now to FIG. 4B, a drawing shows illustrative sets of voltages that are applied to selected and unselected memory cells in the array 30 of FIG. 4A during programming, erasing, and reading operations. For purposes of illustration in FIG. 4B, memory cell 32a of FIG. 4A is designated in FIG. 4B as the selected cell for programming, erasing and reading, while memory cells 32b, 32c, and 32d are designated as unselected cells. In the particular embodiment shown in FIG. 4B the erase voltage (voltage applied to BLN0 in relation to BLP0) is set to be 75% of the programming voltage (voltage applied to BN0 in relation to voltage application to BLP0) to produce an erase current set by biasing the common source p-channel transistor 36a that is no larger than 75% of the programming current to avoid excessive erase current that could damage the ReRAM element in accordance with an aspect of the present invention. The erase current should preferably be lower than the programming current and is preferably between about 30% to about 75% of the programming current. Persons of ordinary skill in the art will appreciate that the voltages used in any particular embodiment of the invention will depend on the actual geometry of the ReRAM element used. From an examination of FIG. 4B, the sets of voltages to be applied to program, erase and read any of memory cells 32b, 32c, and 32d in particular embodiments will be readily apparent to such skilled persons.

As with the array 10 of FIG. 3A, it can be seen from an examination of the array 30 of FIG. 4A that the circuit component arrangement and biasing is such that one of the on-state transistors in each cell in the circuit is operating in a common source mode. The common source transistor is set by the appropriate respective word and bit line voltages to operate in saturation and thus the respective transistors of the cell provide current limiting during both programming and erasing when the ReRAM element is in its low resistance state thus preventing the overcurrent that occurs during state switching in prior-art ReRAM memory cell operation and assuring more consistent erasing.

An advantage of the memory cell of FIG. 3A is that it is smaller than the memory cell of FIG. 4A and is able to deliver more current to the ReRAM element during programming and erasing than the memory cell of FIG. 4A because the parasitic resistance of the extra transistor in both the programming path and the erase path of the memory cell of FIG. 4A limits the amount of current passed by the memory cell. A disadvantage of the memory cell of FIG. 3A is that decoded power needs to be provided in both the row and column directions. The memory cell of FIG. 4A eliminates the need to provided decoded power in the row direction at the expense of the larger cell area required by the additional two transistors.

Figure 5A:
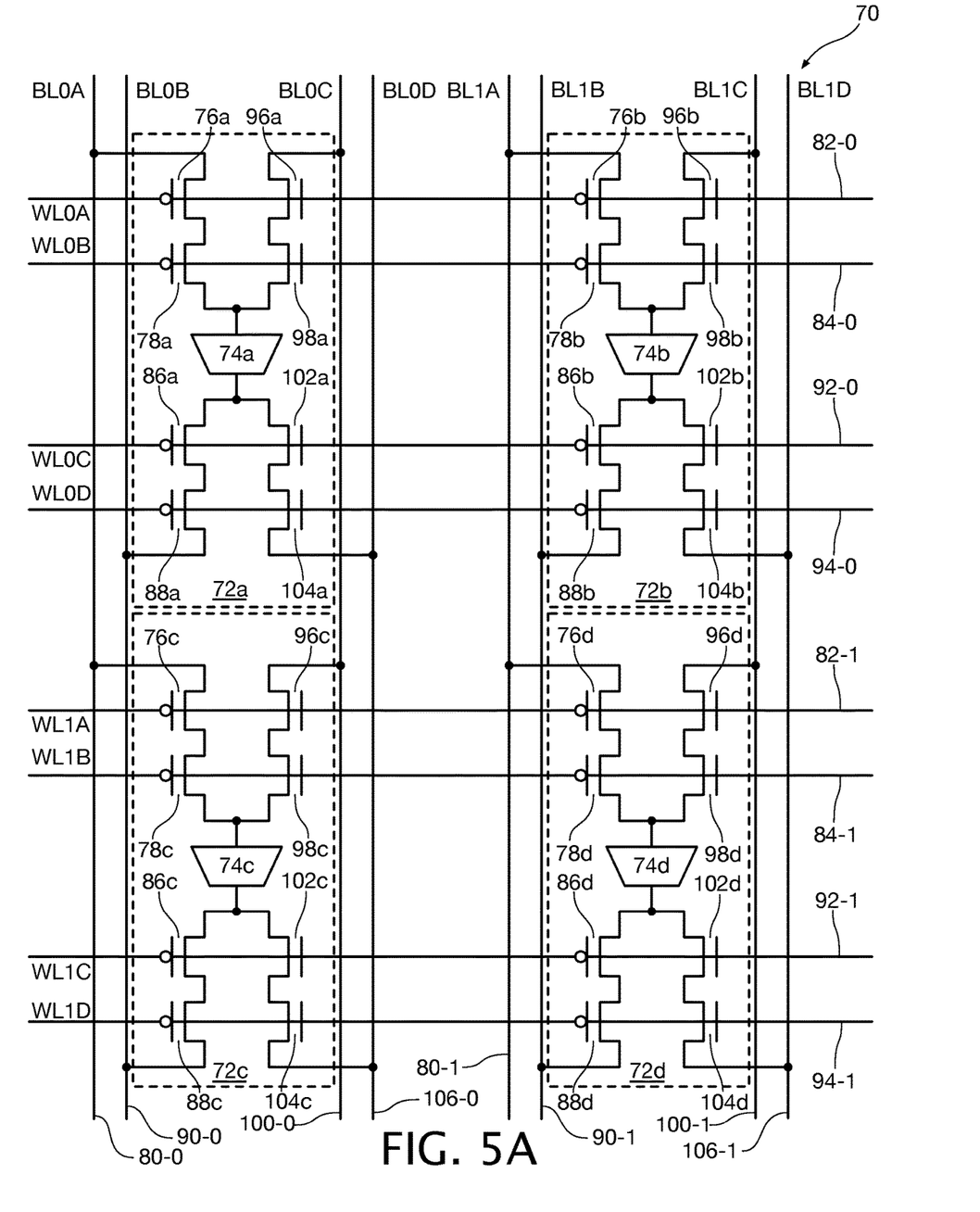
FIG. 5A is a schematic diagram of an illustrative array of 3-volt ReRAM cells in accordance with an aspect of the invention.

Referring now to FIG. 5A, a schematic diagram shows another illustrative embodiment of an array 70 of metal filament ReRAM cells in accordance with an aspect of the present invention that provides current limiting during programming and erasing in accordance with an aspect of the present invention. The array 70 is a representative array showing two rows and two columns of metal filament ReRAM cells. The circuit of FIG. 5A employs series-connected pairs of transistors and is useful where the process technology utilizes 1.8V transistors while still withstanding a 3-volt power supply voltage. The use of a series-connected pair of transistors in place of a single transistor splits the voltage drop across the two transistors allowing the use of transistors having lower maximum drain-to-source voltages.

A first row of the array includes metal filament ReRAM cells 72a and 72b shown in dashed lines and a second row of the array includes metal filament ReRAM cells 72c and 72d shown in dashed lines.

Each memory cell 72a, 72b, 72c, and 72d includes a metal filament ReRAM element identified at reference numerals 74a, 74b, 74c, and 74d. Each ReRAM element in each row has first and second terminals. The one of its terminals closest to its ion source is depicted having the wide end and is designated as the first terminal.

In the first row and first column of the array 70, the first terminal of ReRAM element 74a is connected through a series-connected pair of p-channel transistors 76a and 78a to a first bit line BL0A 80-0 associated with the first column of the array 70. The gate of the p-channel transistor 76a is connected to a word line WL0A 82-0 associated with the first row of the array 70 and the gate of the p-channel transistor 78a is connected to a word line WL0B 84-0 associated with the first row of the array 70.

The second terminal of ReRAM element 74a is connected through a series-connected pair of p-channel transistors 86a and 88a to a second bit line BL0B 90-0 associated with the first column of the array 70. The gate of the p-channel transistor 86a is connected to a word line WL0C 92-0 associated with the first row of the array 70 and the gate of the p-channel transistor 88a is connected to a word line WL0D 94-0 associated with the first row of the array 70.

The first terminal of ReRAM element 74a is also connected through a series-connected pair of n-channel transistors 96a and 98a to a third bit line BL0C 100-0 associated with the first column of the array 70. The gate of the n-channel transistor 96a is connected to the word line WL0A 82-0 associated with the first row of the array 70 and the gate of the n-channel transistor 98a is connected to the word line WL0B 84-0 associated with the first row of the array 70.

The second terminal of ReRAM element 74a is also connected through a series-connected pair of n-channel transistors 102a and 104a to a fourth bit line BL0D 106-0 associated with the first column of the array 70. The gate of the n-channel transistor 102a is connected to the word line WL0C 92-0 associated with the first row of the array 70 and the gate of the n-channel transistor 104a is connected to the word line WL0D 94-0 associated with the first row of the array 70.

In the first row and second column of the array 70, the first terminal of ReRAM element 74b is connected through a series-connected pair of p-channel transistors 76b and 78b to a first bit line BL1A 80-1 associated with the second column of the array 70. The gate of the p-channel transistor 76b is connected to the word line WL0A 82-0 associated with the first row of the array 70 and the gate of the p-channel transistor 78b is connected to the word line WL0B 84-0 associated with the first row of the array 70.

The second terminal of ReRAM element 74b is connected through a series-connected pair of p-channel transistors 86b and 88b to a second bit line BL1B 90-1 associated with the second column of the array 70. The gate of the p-channel transistor 86b is connected to the word line WL0C 92-0 associated with the first row of the array 70 and the gate of the p-channel transistor 88b is connected to the word line WL0D 94-0 associated with the first row of the array 70.

The first terminal of ReRAM element 74b is also connected through a series-connected pair of n-channel transistors 96b and 98b to a third bit line BL1C 100-1 associated with the second column of the array 70. The gate of the n-channel transistor 96b is connected to the word line WL0A 82-0 associated with the first row of the array 70 and the gate of the n-channel transistor 98b is connected to the word line WL0B 84-0 associated with the first row of the array 70.

The second terminal of ReRAM element 74b is also connected through a series-connected pair of n-channel transistors 102b and 104b to a fourth bit line BL1D 106-1 associated with the second column of the array 70. The gate of the n-channel transistor 102b is connected to the word line WL0C 92-0 associated with the first row of the array 70 and the gate of the n-channel transistor 104b is connected to the word line WL0D 94-0 associated with the first row of the array 70.

In the second row and first column of the array 70, the first terminal of ReRAM element 74c is connected through a series-connected pair of p-channel transistors 76c and 78c to the first bit line BL0A 80-0 associated with the first column of the array 70. The gate of the p-channel transistor 76c is connected to a word line WL1A 82-1 associated with the second row of the array 70 and the gate of the p-channel transistor 78c is connected to a word line WL1B 84-1 associated with the second row of the array 70.

The second terminal of ReRAM element 74c is connected through a series-connected pair of p-channel transistors 86c and 88c to the second bit line BL0B 90-0 associated with the first column of the array 70. The gate of the p-channel transistor 86c is connected to the word line WL1C 92-1 associated with the second row of the array 70 and the gate of the p-channel transistor 88c is connected to the word line WL1D 94-1 associated with the second row of the array 70.

The first terminal of ReRAM element 74c is also connected through a series-connected pair of n-channel transistors 96c and 98c to the third bit line BL0C 100-0 associated with the first column of the array 70. The gate of the n-channel transistor 96c is connected to the word line WL1A 82-1 associated with the second row of the array 70 and the gate of the n-channel transistor 98c is connected to the word line WL1B 84-1 associated with the second row of the array 70.

The second terminal of ReRAM element 74c is also connected through a series-connected pair of n-channel transistors 102c and 104c to the fourth bit line BL0D 106-0 associated with the first column of the array 70. The gate of the n-channel transistor 102c is connected to the word line WL1C 92-1 associated with the second row of the array 70 and the gate of the n-channel transistor 104c is connected to the word line WL1D 94-1 associated with the second row of the array 70.

In the second row and second column of the array 70, the first terminal of ReRAM element 74d is connected through a series-connected pair of p-channel transistors 76d and 78d to the first bit line BL1A 80-1 associated with the second column of the array 70. The gate of the p-channel transistor 76*d* is connected to the word line WL1A 82-1 associated with the second row of the array 70 and the gate of the p-channel transistor 78*d* is connected to a word line WL1B 84-1 associated with the second row of the array 70.

The second terminal of ReRAM element 74*d* is connected through a series-connected pair of p-channel transistors 86*d* and 88*d* to the second bit line BL1B 90-1 associated with the second column of the array 70. The gate of the p-channel transistor 86*d* is connected to the word line WL1C 92-1 associated with the second row of the array 70 and the gate of the p-channel transistor 88*d* is connected to the word line WL1D 94-1 associated with the second row of the array 70.

The first terminal of ReRAM element 74*d* is also connected through a series-connected pair of n-channel transistors 96*d* and 98*d* to the third bit line BL1C 100-1 associated with the second column of the array 70. The gate of the n-channel transistor 96*d* is connected to the word line WL1A 82-1 associated with the second row of the array 70 and the gate of the n-channel transistor 98*d* is connected to the word line WL1B 84-1 associated with the second row of the array 70.

The second terminal of ReRAM element 74*d* is also connected through a series-connected pair of n-channel transistors 102*d* and 104*d* to a fourth bit line BL1D 106-1 associated with the second column of the array 70. The gate of the n-channel transistor 102*d* is connected to the word line WL1C 92-1 associated with the second row of the array 70 and the gate of the n-channel transistor 104*d* is connected to the word line WL1D 94-1 associated with the second row of the array 70.

Referring to memory cell 72*a*, it can be seen that the programming circuit for ReRAM element 74*a* comprises series connected p-channel programming transistors 76*a* and 78*a* and series connected n-channel programming transistors 102*a* and 104*a*. The erase circuit for ReRAM element 74*a* comprises series connected n-channel erase transistors 96*a* and 98*a* and series connected p-channel erase transistors 86*a* and 88*a*.

Figure 5B:
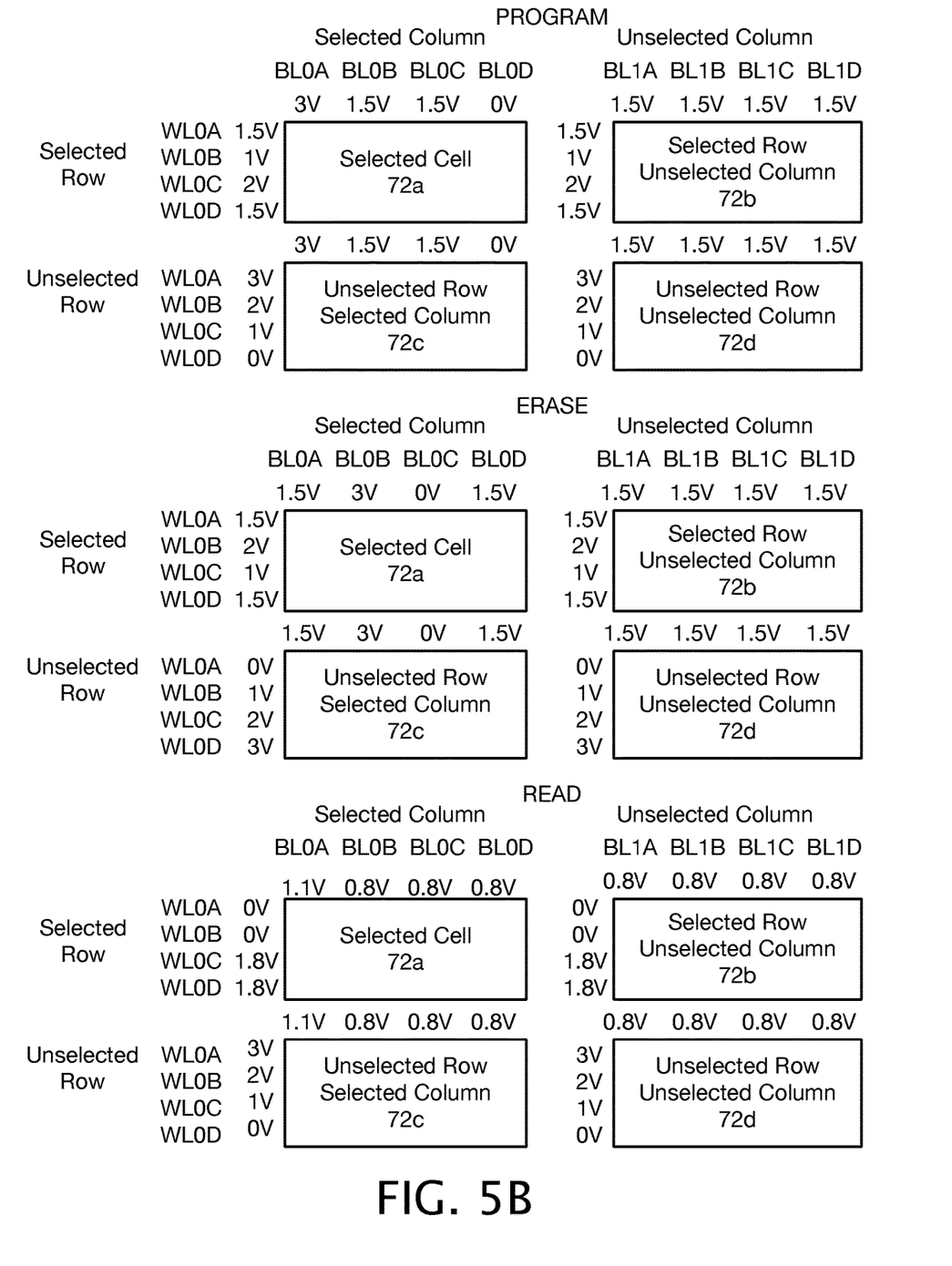
FIG. 5B is a drawing showing illustrative voltages applied to selected and unselected memory cells in the array of FIG. 5A during programming, erasing, and reading operations.

Referring now to FIG. 5B, a drawing shows illustrative sets of voltages that are applied to selected and unselected memory cells in the array 70 of FIG. 5A during programming, erasing, and reading operations. For purposes of illustration in FIG. 5B, memory cell 72*a* of FIG. 5A is designated in FIG. 5B as the selected cell for programming, erasing and reading, while memory cells 72*b*, 72*c*, and 72*d* are designated as unselected cells. From an examination of FIG. 5B, the sets of voltages to be applied to program, erase and read any of memory cells 72*b*, 72*c*, and 72*d* will be readily apparent to persons of ordinary skill in the art.

As with the arrays 10 and 30 of FIG. 3A and FIG. 4A it can be seen from an examination of the array 70 of FIG. 5A that the circuit component arrangement and biasing is such that one of the transistors closest to a bit line in each of the on-state transistor pairs in each cell in the circuit is operating in a common source mode since its source is biased at the bit line in reference to one of the power supply voltages. The common source transistor provides source bias for the second transistor in each pair, allowing a higher gate voltage to be applied to the second transistor to reduce GIDL on the drain of the second transistor. The common source transistor pair is set by the appropriate respective word and bit line voltages to operate in saturation and thus the respective transistors of the memory cell provide current limiting during both programming and erasing when the ReRAM element is in its low resistance state thus preventing the overcurrent that occurs during state switching in prior-art ReRAM memory cell operation and assuring more consistent erasing.

Figure 6:
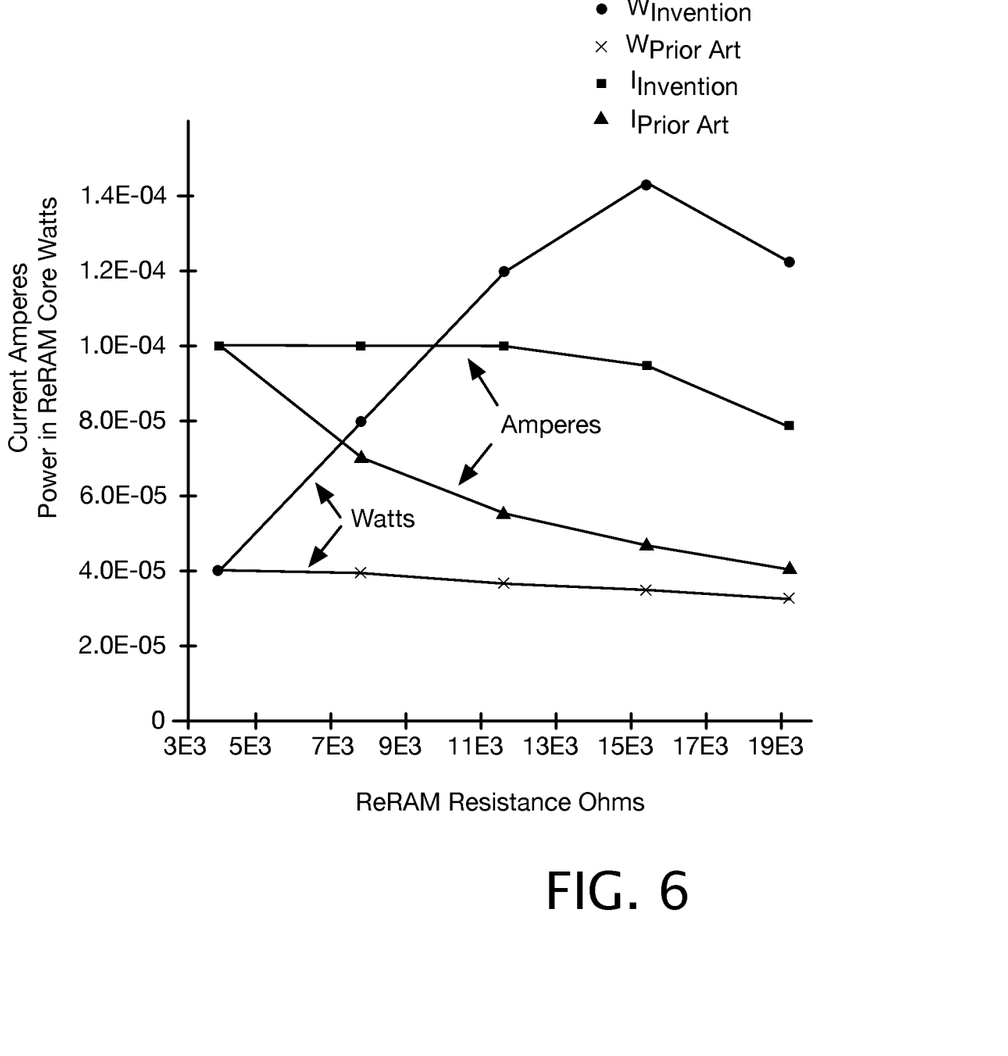
FIG. 6 is a graph comparing erase current and voltage curves for prior-art ReRAM memory cells and ReRAM memory cells in accordance with the present invention.

Referring now to FIG. 6, a graph is presented where the erasing current and corresponding power dissipated by the ReRAM element are plotted as a function of the ReRAM element resistance for both the prior art ReRAM memory cell and for a ReRAM memory cell in accordance with the present invention. As can be seen in the prior art case as the filament begins to open as the ReRAM element transitions from a low resistance state to a high resistance state the current drops steeply resulting in a cooling of the filament and the electrolyte, freezing the filament quickly. In the case of ReRAM memory cells in accordance with the present invention where the drain of the p-channel transistor is connected to the ReRAM element and the source is connected to the erasing voltage supply, the current level is stable and the power dissipated across the ReRAM element increases over about an order of magnitude over the change in resistance of the ReRAM element. Hence as the filament increases in resistance, the voltage across the ReRAM element increases. The configuration of the ReRAM memory cell of the present invention maintains the level of erase current thus maintaining the temperature of the filament as it disintegrates. This results in a larger gap in the filament and a consistently higher resistance. This is a result of the p-channel transistor operating in the saturation mode which maintains a constant current level despite the increasing resistance of the ReRAM element as it transitions from the low resistance state. Thus, in accordance with the present embodiments, an improved ReRAM memory cell is presented with current limiting transistors provided for both programming and erasing. This results in control of both damaging current spikes and premature shut down of the element during erase, provided by two separate current controlled paths, one for programming and one for erasing.

Figure 7:
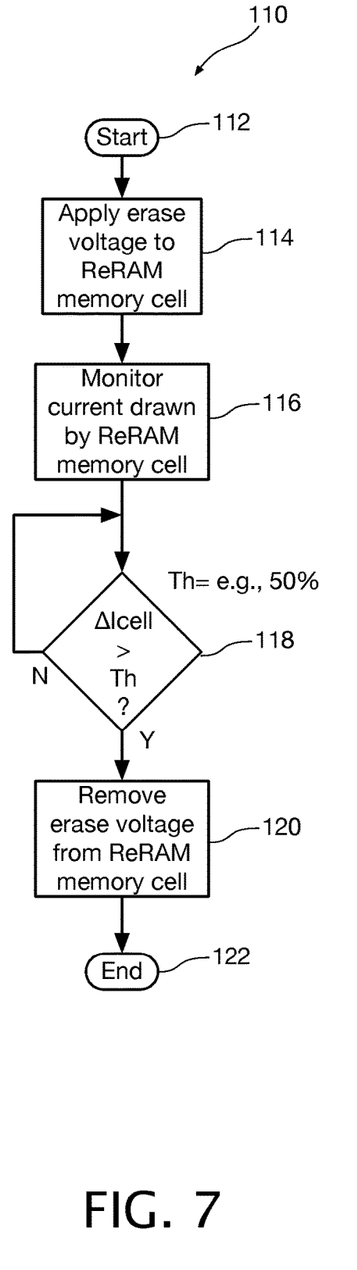
FIG. 7 is a flow diagram showing an illustrative method for erasing a ReRAM memory cell in accordance with an aspect of the present invention.

Referring now to FIG. 7, a flow diagram shows an illustrative method 110 for erasing a ReRAM memory cell in accordance with an aspect of the present invention. The method begins at reference numeral 112.

At reference numeral 114 an erase potential is applied to the ReRAM memory cell. At reference numeral 116, during the time that the erase potential is applied to the ReRAM memory cell the erase current is monitored. At reference numeral 118 a determination is made whether a decrease A in the erase current is greater than a predetermined threshold. In one instance of the invention, the predetermined threshold is set to be about a 50% decrease from the initial value of erase current. The method loops through reference numeral 118 until the decrease A in the erase current through the ReRAM memory cell is greater than the predetermined threshold at which time the method proceeds to reference numeral 120 where the erase voltage is removed from the ReRAM memory cell. The method ends at reference numeral 122.

Figure 8:
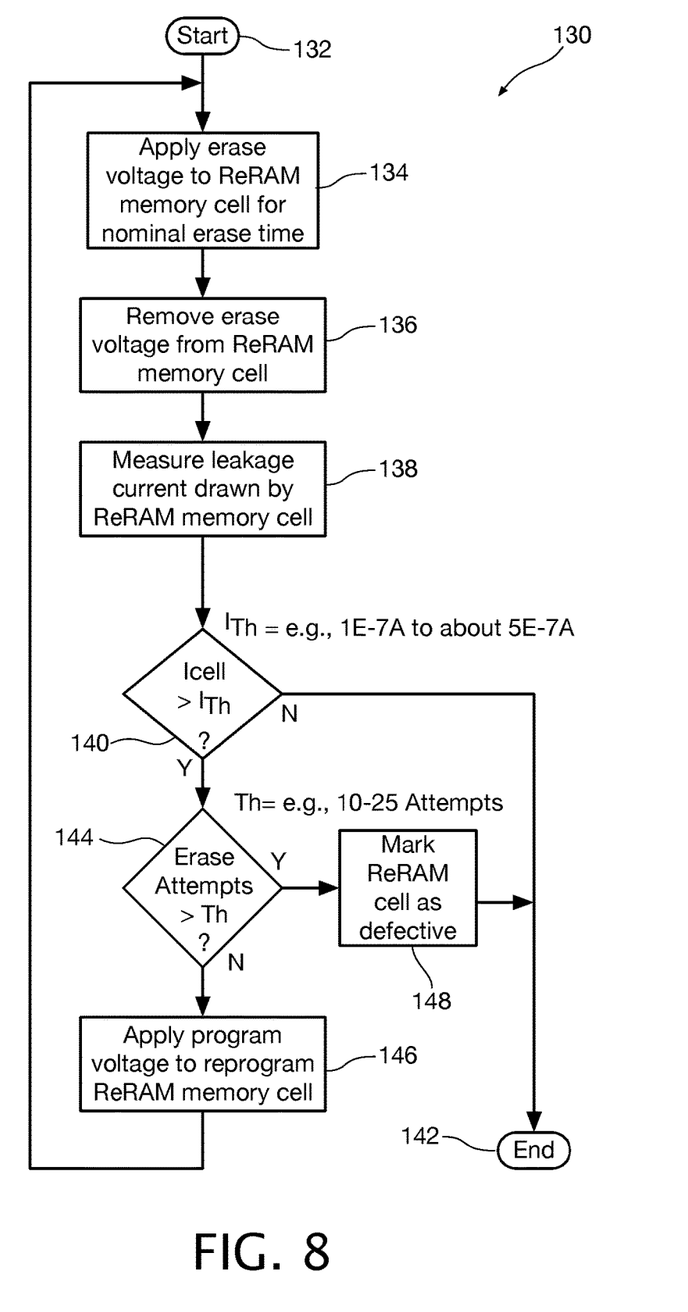
FIG. 8 is a flow diagram showing an illustrative method for erasing a ReRAM memory cell in accordance with an aspect of the present invention.

Referring now to FIG. 8, a flow diagram shows an illustrative method 130 for erasing a ReRAM memory cell in accordance with an aspect of the present invention. The method begins at reference numeral 132.

At reference numeral 134 an erase potential is applied to the ReRAM memory cell for a nominal erase time. At reference numeral 136, the erase potential is removed from the ReRAM memory cell. At reference numeral 138 the leakage current drawn by the erased ReRAM memory cell is measured. At reference numeral 140 a determination is made whether the leakage current drawn by the erased ReRAM memory cell exceeds a predetermined threshold. In one instance of the invention, the predetermined threshold is set be between about 1E-7A and about 5E-7A (i.e., about 100 nano-Amperes to about 500 nano-Amperes).

If the leakage current drawn by the erased ReRAM memory cell does not exceed the predetermined threshold the method ends at reference numeral 142. If the leakage current drawn by the erased ReRAM memory cell exceeds the predetermined threshold the method proceeds to reference numeral 144 where it is determined whether the number of erase attempts exceeds a predetermined threshold. In one instance of the invention, that threshold is set be between about 10 and about 25 erase attempts. If the number of erase attempts does not exceed the predetermined threshold the method proceeds to reference numeral 146 where the ReRAM cell is reprogrammed, and then to reference numeral 134 where the ReRAM memory cell is again erased.

If the number of erase attempts exceeds the predetermined threshold the method proceeds to reference numeral 148 where the ReRAM cell is marked as defective. The method then ends at reference numeral 122.

Figure 9:
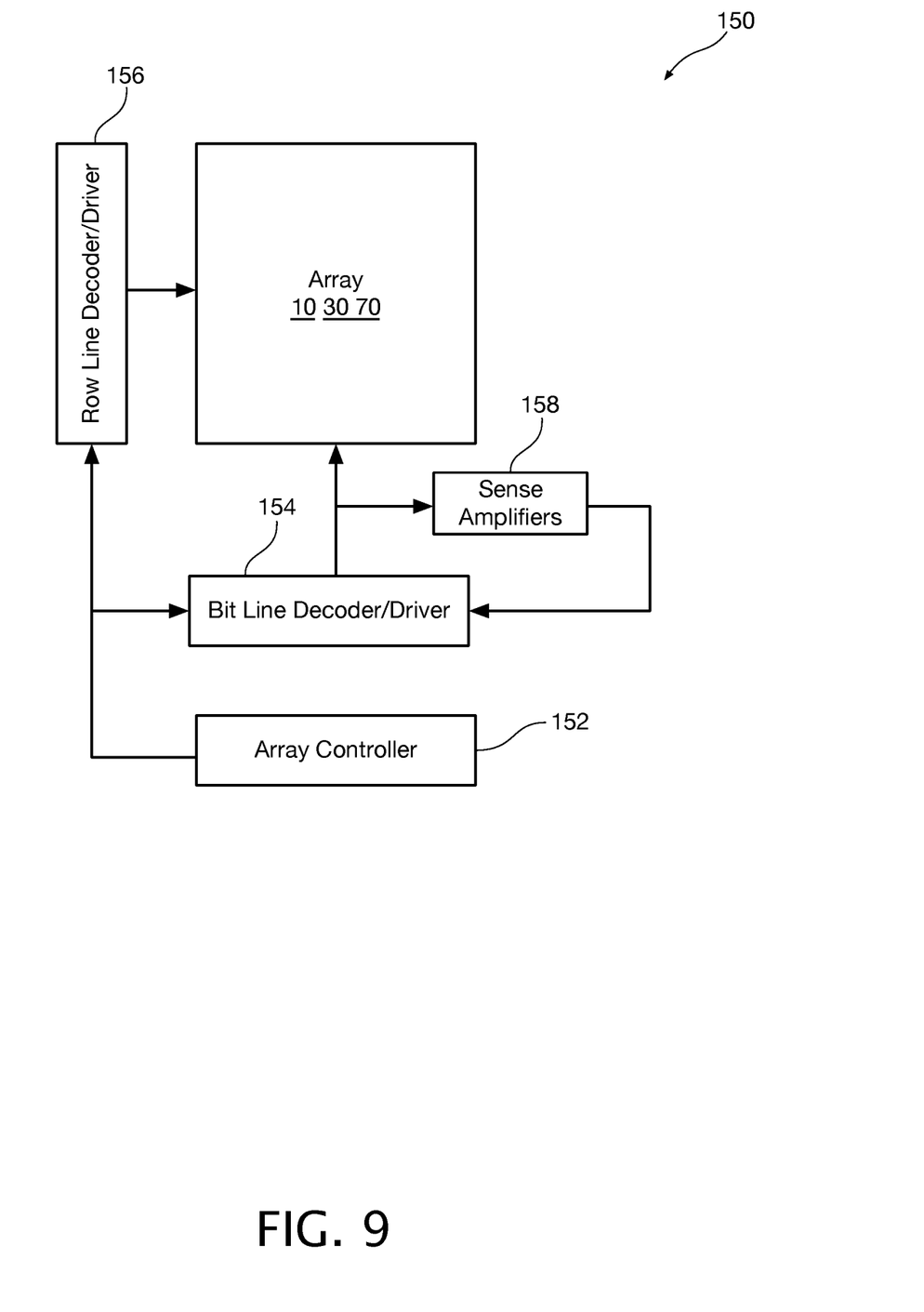
FIG. 9 is a block diagram showing illustrative circuitry for driving and controlling operation of memory arrays in accordance with the present invention.

Referring now to FIG. 9, a block diagram shows illustrative circuitry 150 for driving and controlling operation of memory arrays in accordance with the present invention. A controller 152 is coupled to bit line decoder 154 and row line decoder 156. Bit line decoder 154 and row line decoder 156 respectively generate the bit lines and row lines of the arrays 10, 30, and 70 to the voltages necessary to perform programming reading and erasing ReRAM memory cells in the arrays. Controllers, bit line decoders and row line decoders are well known in the art and design of any particular controllers 152, bit line decoder 154 and row line decoder 156 is well within the level of ordinary skill in the art. Sense amplifiers 158 sense the outputs of the ReRAM cells for both reading the outputs of the memory cells and performing the monitoring and measuring operations shown at reference numeral 118 of FIG. 7 and reference numeral 140 of FIG. 8. The controller 152 can also control the performance of the steps shown at reference numerals 144 and 148 of FIG. 8. Configuring controller 152 to perform these tasks is well known to those skilled in the art of ReRAM memory array design.

The advantage of the approach of the present invention is that it provides faster erasing because fewer multiple sense and re-erase cycles will be needed. This in turn extends the life of the ReRAM element by reducing the stress and unnecessary damage to the metal filament. In addition, the approach of the present invention results in a ReRAM element having consistently higher resistance in the off state which allows the ReRAM element to be employed as a programmable element in additional circuit applications.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A ReRAM memory cell for use in a memory array, the ReRAM memory cell comprising:
   a ReRAM element having a first terminal and a second terminal, the first terminal connected to an ion-source electrode in the ReRAM element and coupled to a row power line in a row of the memory array;
   a programming circuit coupled to the ReRAM element and defining a programming circuit path in the ReRAM memory cell, the programming circuit including an n-channel transistor coupled between the second terminal of the ReRAM element and a first column bit line in a column of the memory array, the n-channel transistor having a gate coupled to an n-word line in the row of the memory array; and
   an erase circuit coupled to the ReRAM element and defining an erase circuit path in the ReRAM memory cell, the erase circuit including a p-channel transistor coupled between the second terminal of the ReRAM element and a second column bit line in the column in the memory array, the p-channel transistor having a gate coupled to a p-word line in the row of the memory array.

2. A ReRAM memory cell for use in a memory array, the ReRAM memory cell comprising:
   a ReRAM element having a first terminal and a second terminal, the first terminal connected to an ion-source electrode in the ReRAM element;
   a programming circuit coupled to the ReRAM element and defining a programming circuit path in the ReRAM memory cell, the programming circuit including a p-channel programming transistor coupled between the first terminal of the ReRAM element and a first column bit line in a column of the memory array, the p-channel programming transistor having a gate coupled to a first p-word line in a row of the memory array, and an n-channel programming transistor coupled between the second terminal of the ReRAM element and a second column bit line in the column in the memory array, the n-channel programming transistor having a gate coupled to a first n-word line in the row of the memory array; and
   an erase circuit coupled to the ReRAM element and defining an erase circuit path in the ReRAM memory cell, the erase circuit including an n-channel erase transistor coupled between the first terminal of the ReRAM element and the second column bit line in the column in the memory array, the n-channel erase transistor having a gate coupled to a second n-word line in the row of the memory array, and a p-channel erase transistor coupled between the second terminal of the ReRAM element and the first column bit line in the column in the memory array, the p-channel erase transistor having a gate coupled to a second p-word line in the row of the memory array.

3. A ReRAM memory cell for use in a memory array, the ReRAM memory cell comprising:
   a ReRAM element having a first terminal and a second terminal, the first terminal connected to an ion-source electrode in the ReRAM element;
   a programming circuit coupled to the ReRAM element and defining a programming circuit path in the ReRAM memory cell, the programming circuit including series-connected first and second p-channel programming transistors coupled between the first terminal of the ReRAM element and a first column bit line in a column in the memory array, the first one of the series connected p-channel programming transistors having a gate coupled to a first word line in a row of the memory array, the second one of the series connected p-channel programming transistors having a gate coupled to a second word line in the row of the memory array, and series connected first and second n-channel programming transistors coupled between the second terminal of the ReRAM element and a second column bit line in the column in the memory array, the first one of the series connected n-channel programming transistors having a gate coupled to a third word line in the row of the memory array, the second one of the series connected n-channel programming transistors having a gate coupled to a fourth word line in the row of the memory array; and an erase circuit coupled to the ReRAM element and defining an erase circuit path in the ReRAM memory cell, the erase circuit including series-connected first and second n-channel erase transistors coupled between the first terminal of the ReRAM element and a third column bit line in the column in the memory array, the first one of the series connected n-channel erase transistors having a gate coupled to the first word line in the row of the memory array, the second one of the series connected n-channel erase transistors having a gate coupled to the second word line in the row of the memory array, and series-connected first and second p-channel erase transistors coupled between the second terminal of the ReRAM element and a fourth column bit line in the column in the memory array, the first one of the series connected p-channel erase transistors having a gate coupled to the third word line in the row of the memory array, the second one of the series connected p-channel erase transistors having a gate coupled to the fourth word line in the row of the memory array.

4. A method for operating a ReRAM memory cell, the method comprising:
providing a ReRAM memory cell having a ReRAM element, a programming circuit coupled to the ReRAM element and defining a programming circuit path in the ReRAM memory cell including at least one transistor configured in common source mode, and an erase circuit coupled to the ReRAM element and defining an erase circuit path in the ReRAM memory cell including at least one transistor configured in common source mode, the erase circuit path being different from the programming circuit path; and
applying an erase potential to the ReRAM memory cell through the erase circuit path to erase the ReRAM memory cell;
monitoring current drawn by the ReRAM memory cell while the erase potential is being applied; and
removing the erase potential from the ReRAM memory cell when the decrease in current drawn by the ReRAM memory cell is greater that a preselected current threshold.

5. The method of claim 4 wherein the preselected current threshold is about a 50% decrease from the initial value of erase current.

6. The method of claim 4 further comprising:
applying a programming potential to the ReRAM memory cell through the programming circuit path to program the ReRAM memory cell.

7. A method for operating a ReRAM memory cell, the method comprising:
applying an erase potential to the ReRAM memory cell for a nominal erase time;
removing the erase potential from the ReRAM memory cell;
measuring leakage current drawn by the ReRAM memory cell;
if the leakage current drawn by the ReRAM memory cell is less than a predetermined threshold, ending the method;
if the leakage current drawn by the ReRAM memory cell is greater than the predetermined threshold, reprogramming the ReRAM memory cell; and
after the reprogramming the ReRAM memory cell, again applying the erase potential to the ReRAM memory cell for the nominal erase time.

8. The method of claim 7 wherein the leakage current predetermined threshold is between about 100 nano-Amperes to 500 nano-Amperes.

9. The method of claim 7 further comprising marking the ReRAM cell as defective if the leakage current drawn by the ReRAM memory cell is greater than the predetermined threshold after reprogramming and erasing the ReRAM memory cell more than a predetermined number of times.

10. The method of claim 9 wherein the predetermined number of times is between about 10 times and about 25 times.

11. A method comprising:
providing a ReRAM memory cell having a ReRAM element, a programming circuit coupled to the ReRAM element and defining a programming circuit path in the ReRAM memory cell including at least one programming transistor configured in common source mode, and an erase circuit coupled to the ReRAM element and defining an erase circuit path in the ReRAM memory cell including at least one erase transistor configured in common source mode, the erase circuit path being different from the programming circuit path; and
applying an erase potential to the ReRAM memory cell through the erase circuit path to cause an erase current to flow through the ReRAM memory cell,
wherein the erase current has a magnitude of between about 30% and about 75% of a magnitude of a programming current used to program the ReRAM memory cell.

* * * * *

UNITED STATES PATENT AND TRADEMARK OFFICE
CERTIFICATE OF CORRECTION

PATENT NO. : 10,878,905 B1
APPLICATION NO. : 16/525546
DATED : December 29, 2020
INVENTOR(S) : John L. McCollum and Fengliang Xue Page 1 of 1

It is certified that error appears in the above-identified patent and that said Letters Patent is hereby corrected as shown below:

In the Specification

Column 1, Line 65 replace "V" with --0V--.
Column 7, Line 12 replace "BLP120-1" with --BLP1 20-1--.
Column 7, Line 13 replace "WLP122-1" with --WLP1 22-1--.
Column 7, Line 18 replace "BLN126-1" with --BLN1 26-1--.
Column 7, Line 25 replace "BLN126-1" with --BLN1 26-1--.
Column 7, Line 26 replace "WLN128-1" with --WLN1 28-1--.
Column 8, Line 2 replace "V" with --0V--.
Column 8, Line 16 replace "WLN" with --WLN0--.
Column 9, Line 43 replace "BLP-138-1" with --BLP1 38-1--.
Column 9, Line 44 replace "BLN-142-1" with --BLN1 42-1--.
Column 10, Line 9 replace "BLN-142-1" with --BLN1 42-1--.

Signed and Sealed this
Thirtieth Day of March, 2021

Drew Hirshfeld
*Performing the Functions and Duties of the
Under Secretary of Commerce for Intellectual Property and
Director of the United States Patent and Trademark Office*